United States Patent
Huber

(10) Patent No.: US 8,289,656 B1
(45) Date of Patent: Oct. 16, 2012

(54) DISK DRIVE COMPRISING STACKED AND STEPPED TRACES FOR IMPROVED TRANSMISSION LINE PERFORMANCE

(75) Inventor: William Don Huber, Hollister, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 895 days.

(21) Appl. No.: 12/273,725

(22) Filed: Nov. 19, 2008

(51) Int. Cl.
*G11B 5/55* (2006.01)
*G11B 21/08* (2006.01)

(52) U.S. Cl. ................................ 360/264.2; 360/281

(58) Field of Classification Search .......... 360/264.2, 360/234.6, 245.8, 246, 281
See application file for complete search history.

(56) References Cited

U.S. PATENT DOCUMENTS

| | | | |
|---|---|---|---|
| 3,617,952 A | 11/1971 | Beech | |
| 4,344,093 A * | 8/1982 | Huber | 360/45 |
| 4,656,533 A * | 4/1987 | Sakai et al. | 360/65 |
| 5,184,095 A | 2/1993 | Hanz et al. | |
| 5,608,591 A | 3/1997 | Klaassen | |
| 5,717,547 A * | 2/1998 | Young | 360/246 |
| 5,737,152 A | 4/1998 | Balakrishnan | |
| 5,771,568 A | 6/1998 | Gustafson | |
| 5,796,552 A | 8/1998 | Akin, Jr. et al. | |
| 5,805,382 A | 9/1998 | Lee et al. | |
| 5,995,328 A | 11/1999 | Balakrishnan | |
| 6,144,981 A | 11/2000 | Kovacs et al. | |
| 6,249,404 B1 | 6/2001 | Doundakov et al. | |
| 6,275,358 B1 | 8/2001 | Balakrishnan et al. | |
| 6,331,919 B1 | 12/2001 | Klaassen et al. | |
| 6,356,113 B1 | 3/2002 | Contreras et al. | |
| 6,424,500 B1 | 7/2002 | Coon et al. | |
| 6,493,190 B1 | 12/2002 | Coon | |
| 6,603,623 B1 | 8/2003 | Fontana, Jr. et al. | |
| 6,608,736 B1 | 8/2003 | Klaassen et al. | |
| 6,714,385 B1 | 3/2004 | Even et al. | |
| 6,762,913 B1 | 7/2004 | Even et al. | |
| 6,891,700 B2 | 5/2005 | Shiraishi et al. | |
| 6,900,967 B1 | 5/2005 | Coon et al. | |
| 6,963,471 B2 | 11/2005 | Arai et al. | |
| 6,975,488 B1 | 12/2005 | Kulangara et al. | |
| 7,019,959 B2 | 3/2006 | Chua | |
| 7,142,073 B2 | 11/2006 | Kim et al. | |
| 7,180,011 B1 | 2/2007 | Hall et al. | |
| 7,986,495 B2 | 7/2011 | Kamei et al. | |
| 2004/0252413 A1 | 12/2004 | Nishiyama | |
| 2005/0180053 A1 | 8/2005 | Dovek et al. | |

(Continued)

OTHER PUBLICATIONS

Scanlan et al. "Microwave Allpass Networks—Part I, Part II", IEEE Transactions on Microwave Theory and Techniques, vol.16, No. 2, Feb. 1968, p. 62-79.

(Continued)

*Primary Examiner* — Huan Hoang

(57) ABSTRACT

A disk drive is disclosed comprising a disk, a head actuated over the disk, a preamp, and an interconnect for coupling the head to the preamp. The interconnect comprises a first transmission line stacked over a second transmission line, and a dielectric between the first transmission line and second transmission line. A shape of the first and second transmission lines varies along a length of the interconnect such that the interconnect comprises an approximation of an inductor/capacitor ladder network.

26 Claims, 5 Drawing Sheets

U.S. PATENT DOCUMENTS

| | | | |
|---|---|---|---|
| 2006/0044695 | A1 | 3/2006 | Erpelding |
| 2006/0092572 | A1 | 5/2006 | Kiyono |
| 2006/0152854 | A1 | 7/2006 | Arya et al. |
| 2007/0178766 | A1 | 8/2007 | Banerjee et al. |
| 2008/0055788 | A1 | 3/2008 | Nagai |
| 2008/0273269 | A1* | 11/2008 | Pro .......................... 360/234.6 |

OTHER PUBLICATIONS

Matthaei et al. "Multiplexer Design", Microwave Filters, Impedance-Matching Networks, and Coupling Structures. Artech House Books, 1980. Ch.16.

Huber et al., "Advanced Interconnect Design for High Data Rate Perpendicular Magnetic Recording", IEEE Transactions on Magnetics, vol. 44, No. 1, pp. 175-180, Jan. 2008.

Yue Ping Zhang et al., "Dual-Band Microstrip Bandpass Filter Using Stepped-Impedance Resonators With New Coupling Schemes", IEEE Transactions on Microwave Theory and Techniques, vol. 54, No. 10, pp. 3779-3785, Oct. 2006.

Klaassen et al., "Writing At High Data Rates", Journal of Applied Physics, vol. 93, No. 10, pp. 6450-6452, May 2003.

* cited by examiner

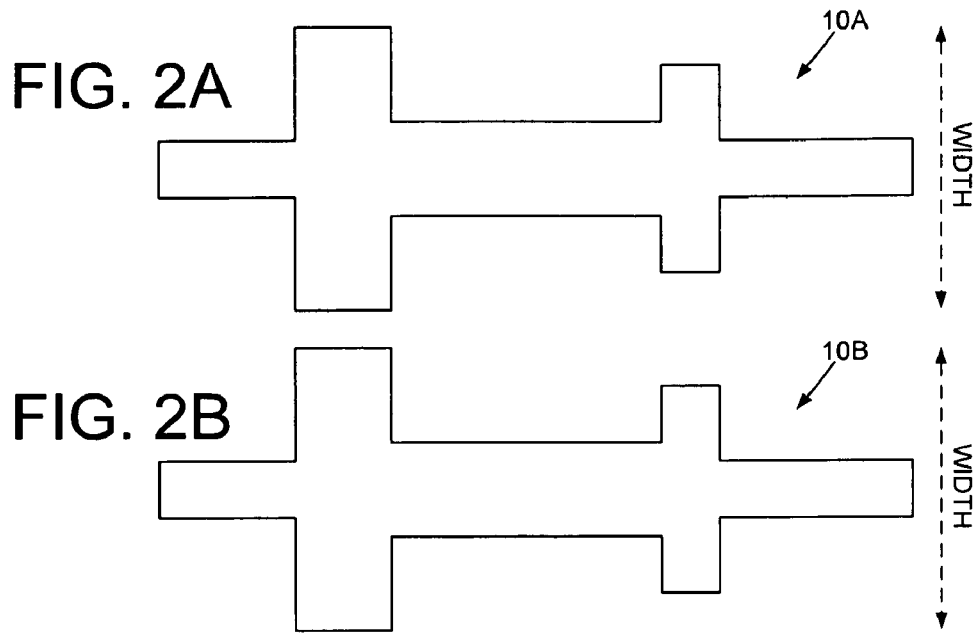
FIG. 2A
FIG. 2B
FIG. 2C
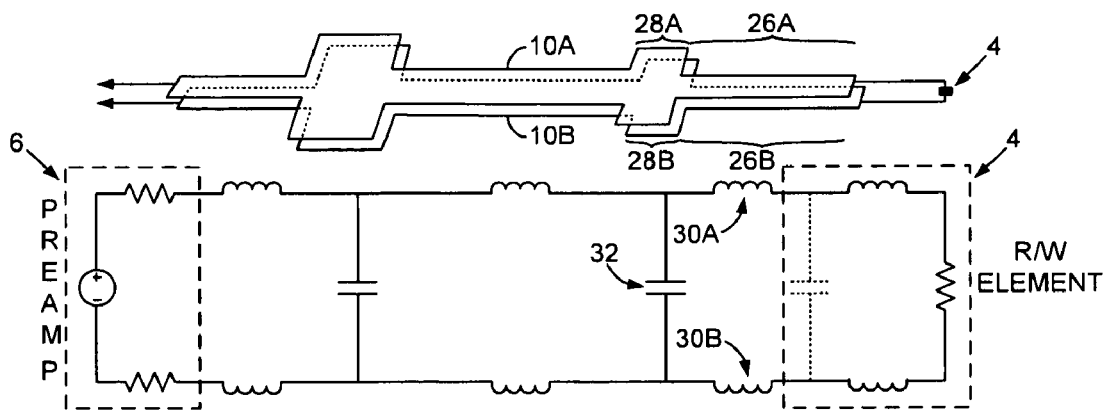
FIG. 2D

US 8,289,656 B1

DISK DRIVE COMPRISING STACKED AND STEPPED TRACES FOR IMPROVED TRANSMISSION LINE PERFORMANCE

BACKGROUND

Description of the Related Art

The head in a disk drive is typically mounted on a slider attached to the end of a suspension. The suspension is attached to a distal end of an actuator arm which is rotated about a pivot by a voice coil motor (VCM) in order to actuate the head radially over the disk. The suspension is fabricated with traces (e.g., copper traces) which act as transmission lines that carry the write/read signals between the head and a preamp. It is important to fabricate the traces so as to optimize the signal-to-noise ratio of the write/read signals.

BRIEF DESCRIPTION OF THE DRAWINGS

FIGS. 2A-2B show a top-down view of top and bottom transmission lines that form at least part of the interconnect, including an approximation of an inductor/capacitor ladder network, according to an embodiment of the present invention.

FIG. 2C shows a cross-section view of the stacked (top and bottom) transmission lines having a dielectric disposed between.

FIG. 2D shows a perspective view of the stacked transmission lines as well as an inductor/capacitor ladder network approximated by symmetrically varying a width of the first and second transmission lines.

DETAILED DESCRIPTION OF EMBODIMENTS OF THE INVENTION

Figure 1A:
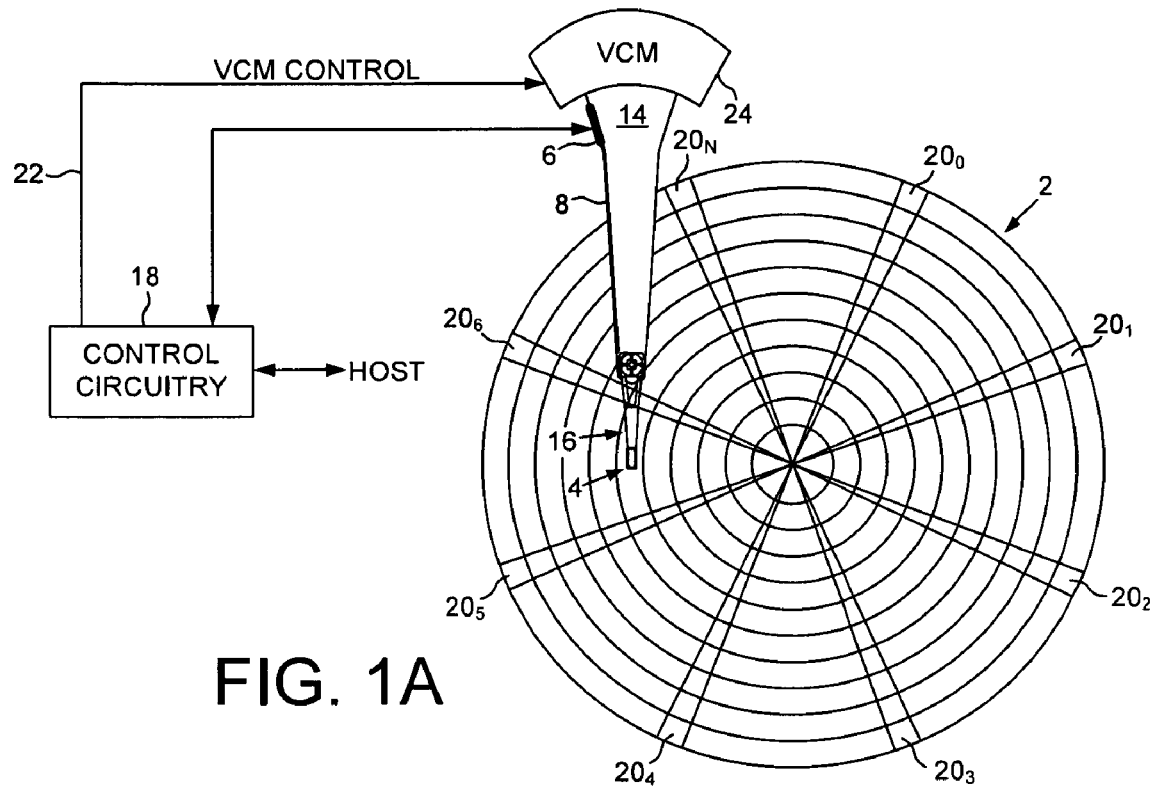
FIG. 1A shows a disk drive according to an embodiment of the present invention comprising a head actuated over a disk.
Figure 1B:
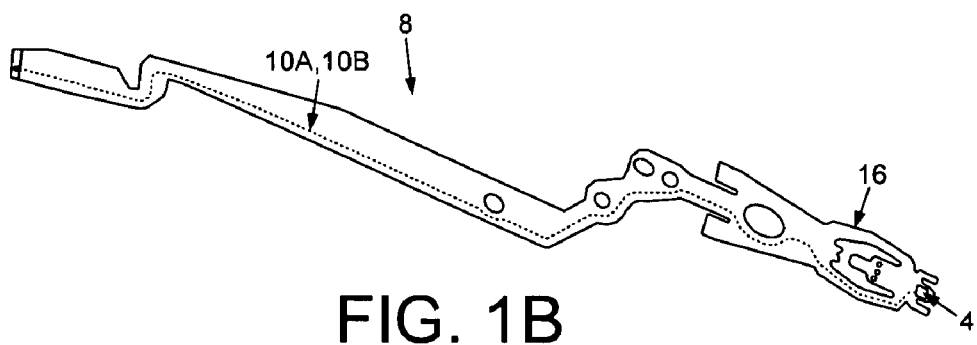
FIG. 1B shows a suspension according to an embodiment of the present invention comprising an interconnect having stacked transmission lines including a section that approximates an inductor/capacitor ladder network.

FIG. 1A shows a disk drive according to an embodiment of the present invention comprising a disk 2, a head 4 actuated over the disk 2, a preamp 6, and an interconnect 8 for coupling the head 4 to the preamp 6. The interconnect 8 comprises a first transmission line 10A stacked over a second transmission line 10B, and a dielectric 12 between the first transmission line 10A and second transmission line 10B (FIGS. 2A-2C). A shape of the first and second transmission lines 10A and 10B varies along a length of the interconnect 8 such that the interconnect 8 comprises an approximation of an inductor/capacitor ladder network (FIG. 2D).

In the embodiment of FIG. 1A, the head 4 is coupled to a distal end of an actuator arm 14 by a suspension 16 that biases the head 4 toward the surface of the disk 2. As the disk 2 spins, an air bearing forms between the head 4 and disk surface such that the head 4 is said to "fly" over the disk surface. Control circuitry 18 generates a write signal applied to the head 4 through the preamp 6 during write operations, and during read operations demodulates a read signal emanating from the head 4 through the preamp 6. The control circuitry 18 may demodulate embedded servo sectors $20_0$-$20_N$ recorded around the circumference of the disk 2 in order to generate a VCM control signal 22 applied to a voice coil motor (VCM) 24 which rotates the actuator arm 14 about a pivot in order to position the head 4 radially over the disk 2.

Any suitable head 4 may be employed in the embodiments of the present invention, such as a head 4 comprising an inductive write element and a magnetoresistive (MR) read element. A write operation is performed by modulating a write current emanating from the preamp 6 and passing through the transmission lines 10A and 10B and through the inductive write element in order to write magnetic transitions onto the disk surface. During a read operation, the read element senses the magnetic transitions to generate a read signal carried by transmission lines 10A and 10B to the preamp 6. Either or both of the write transmission lines and read transmission lines may comprise an approximated inductor/capacitor ladder network according to different embodiments of the present invention.

FIG. 2A shows a top-down view of the top transmission line 10A and FIG. 2B shows a top-down view of the bottom transmission line 10B. The transmission lines 10A and 10B may comprise any suitable conductive material, such as copper. FIG. 2C shows the transmission lines 10A and 10B in a stacked configuration having a suitable dielectric 12 (e.g., a suitable plastic) there between. Any suitable technique may be used to fabricate the stacked transmission lines 10A and 10B such as with a suitable etching technique.

In the embodiment shown in FIGS. 2A-2B, the shape of the first and second transmission lines 10A and 10B that varies comprises a width of the first and second transmission lines as illustrated in the figures. Also in the embodiment of FIGS. 2A-2B, the width of the first transmission line 10A varies symmetrically with the width of the second transmission line 10B.

FIG. 2D shows a perspective view of the stacked transmission lines 10A and 10B according to an embodiment of the present invention (the dielectric is omitted for clarity). The first transmission line 10A comprises a first segment 26A, and the second transmission line 10B comprises a second segment 26B symmetric with the first segment 26A. The first transmission line 10A comprises a third segment 28A, and the second transmission line 10B comprises a fourth segment 28B symmetric with the third segment 28A. The first segment 26A forms a first series inductance 30A, and the second segment 26B forms a second series inductance 30B. The third and fourth segments 28A and 28B form a shunt capacitance 32. In the embodiment of FIG. 2D, a width of the first and second segments 26A and 26B is less than a width of the third and fourth segments 28A and 28B in order to form the inductor and capacitor elements.

The transmission lines 10A and 10B shown in FIG. 2D comprise additional symmetrical segments of varying widths to form the remaining inductor and capacitor elements that form the approximation of the inductor/capacitor ladder network. In an embodiment shown in FIG. 3, the transmission lines 10A and 10B are fabricated such that the approximated inductor/capacitor ladder network helps to flatten a magnitude response of the interconnect 8 over a frequency band of at least one of a read signal and a write signal.

Figure 3:
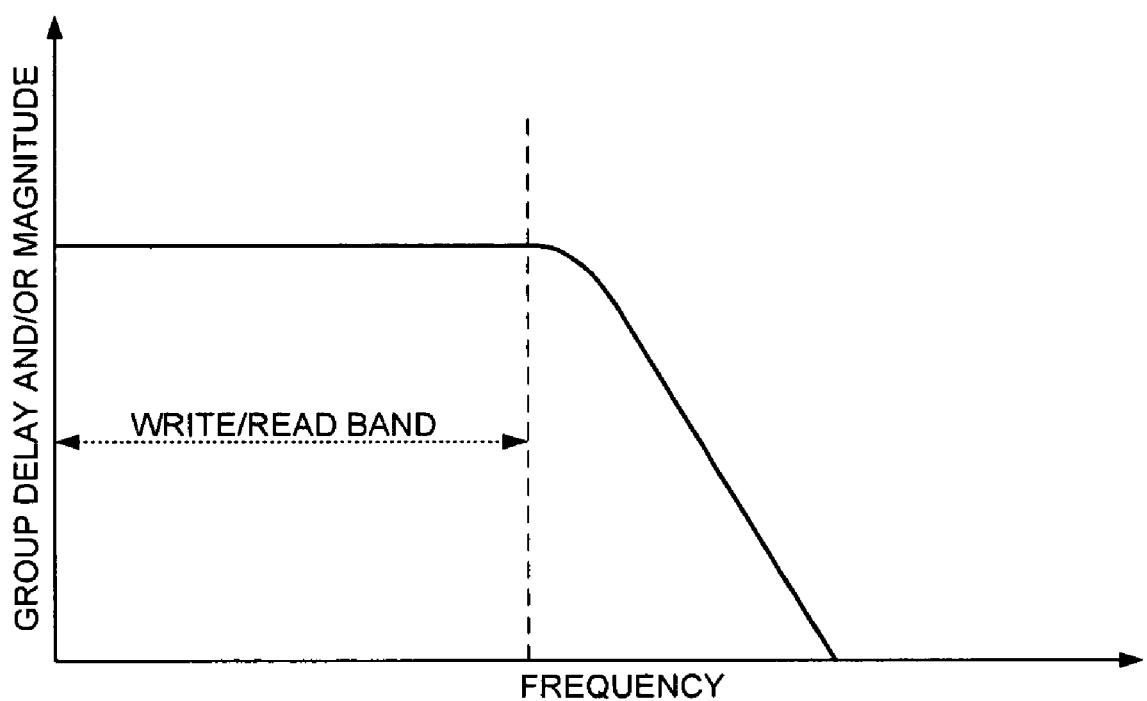
FIG. 3 shows a frequency response (group delay and magnitude) of the interconnect according to an embodiment of the present invention.
Figure 4A:
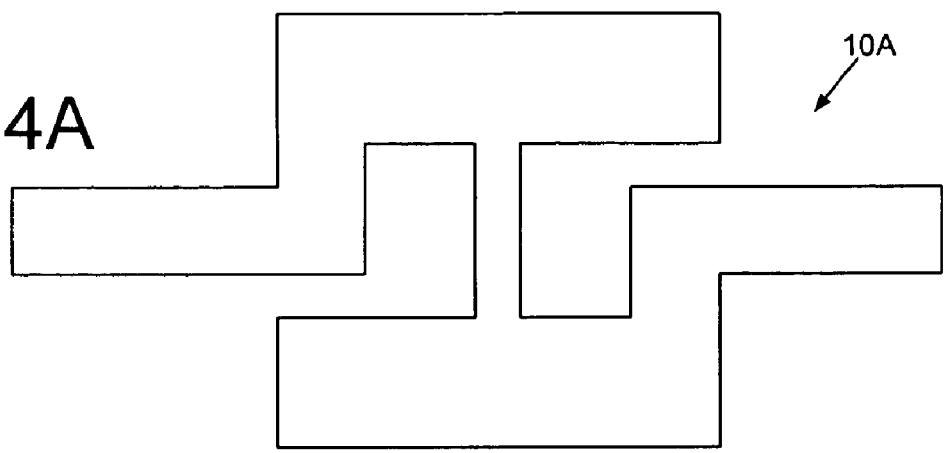
FIGS. 4A-4B show a top-down view of top and bottom transmission lines that form at least part of the interconnect, including an approximation of an inductor/capacitor lattice network, according to an embodiment of the present invention.
Figure 4B:
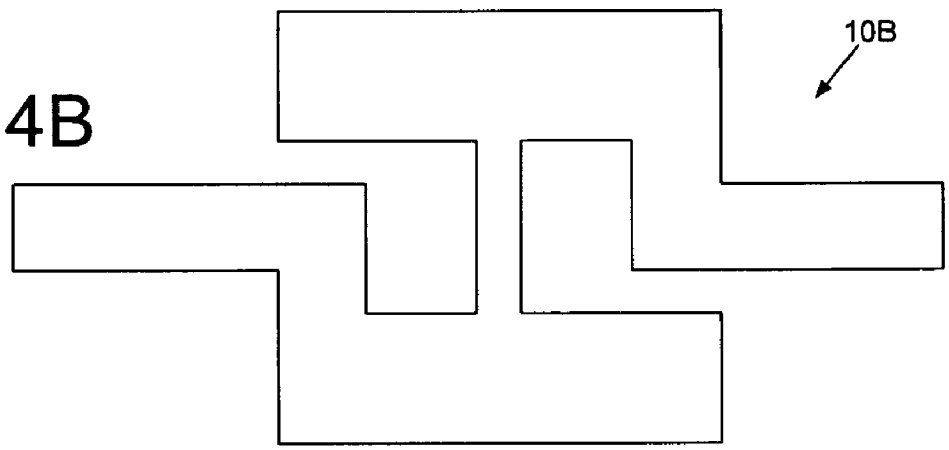
Figure 4C:
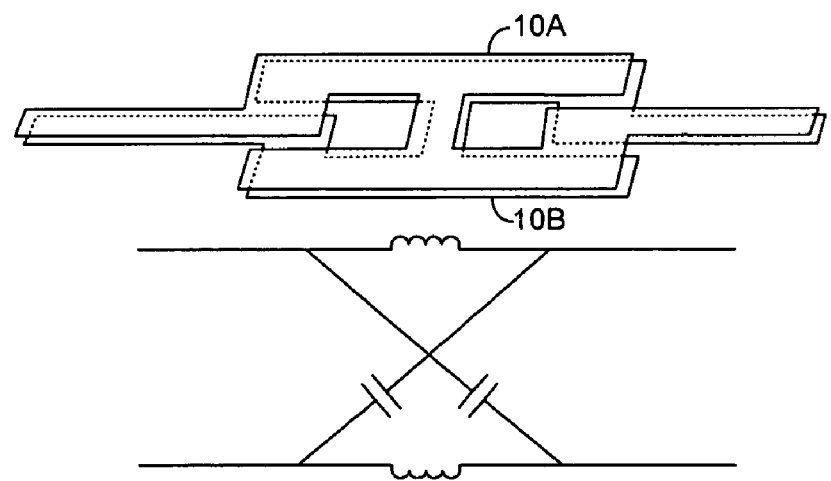
FIG. 4C shows a perspective view of the stacked transmission lines as well as an approximated inductor/capacitor lattice network.

In one embodiment, the approximated inductor/capacitor ladder network boosts the magnitude response at higher frequencies in order to flatten the magnitude response as shown in FIG. 3. However, the approximated inductor/capacitor ladder network may also distort the group delay at higher frequencies. To compensate for the group delay distortion, in an embodiment shown in FIGS. 4A-4C a shape of the first and second transmission lines 10A and 10B varies along a length of the interconnect 8 such that the interconnect comprises an approximation of an inductor/capacitor lattice network. In one embodiment, the approximated inductor/capacitor lattice network compensates for the group delay distortion by flattening the group delay as shown in the embodiment of FIG. 3.

Figure 4D:
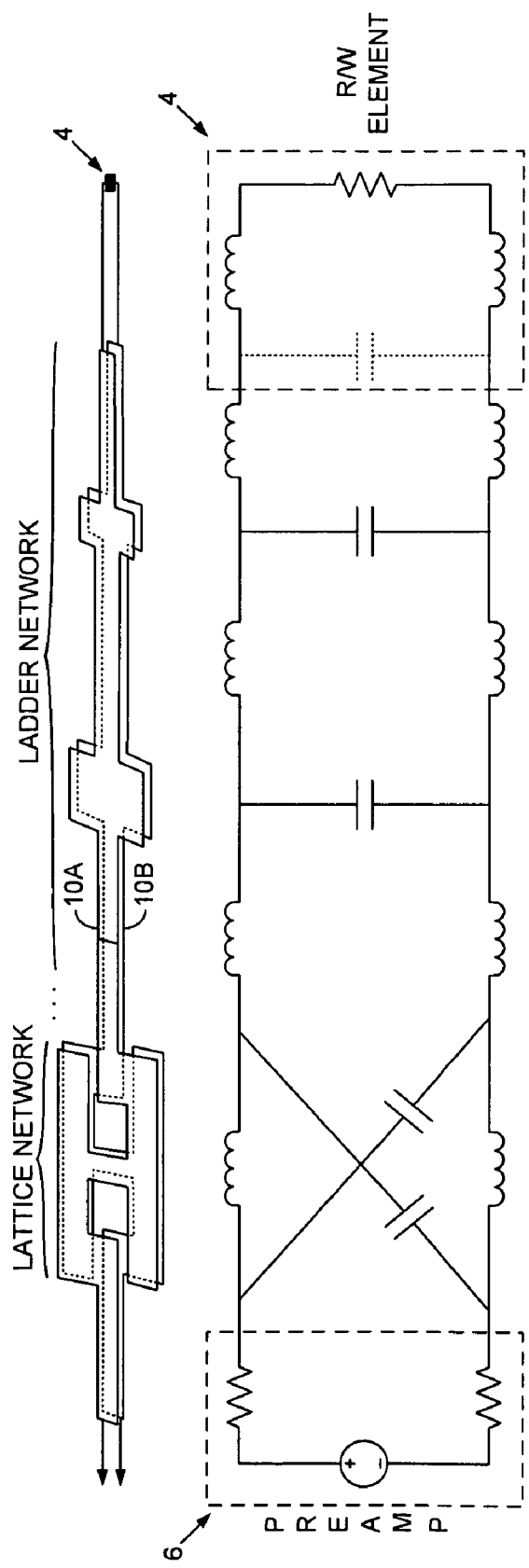
FIG. 4D shows a perspective view of the stacked transmission lines as well as an approximated inductor/capacitor lattice network and approximated inductor/capacitor ladder network.

FIG. 4D shows an embodiment of the present invention wherein the transmission lines 10A and 10B of the interconnect 8 comprise an approximated inductor/capacitor ladder network and an approximated inductor/capacitor lattice network. Any suitable length of transmission line may separate the two networks, and any suitable number of ladder networks (and optionally lattice networks) may be employed along the length of the interconnect 8. In one embodiment, the approximated inductor/capacitor ladder network is fabricated so as to substantially match an impedance of the interconnect 8 to an impedance of the read or write element in the head 4. To facilitate the impedance matching, the approximated inductor/capacitor ladder network is fabricated near the read or write element, whereas the approximated inductor/capacitor lattice network may be fabricated closer to the preamp 6.

What is claimed is:

1. A disk drive comprising:
   a disk;
   a head actuated over the disk;
   a preamp; and
   an interconnect comprising a first transmission line stacked over a second transmission line, and a dielectric between the first transmission line and second transmission line, the interconnect for coupling the head to the preamp, wherein a shape of the first and second transmission lines varies along a length of the interconnect such that the interconnect comprises an approximation of an inductor/capacitor ladder network.

2. The disk drive as recited in claim 1, wherein the shape of the first and second transmission lines comprises a width of the first and second transmission lines.

3. The disk drive as recited in claim 2, wherein the width of the first transmission line varies symmetrically with the width of the second transmission line.

4. The disk drive as recited in claim 1, wherein:
   the first transmission line comprises a first segment;
   the second transmission line comprises a second segment symmetric with the first segment;
   the first transmission line comprises a third segment;
   the second transmission line comprises a fourth segment symmetric with the third segment;
   the first segment forms a first series inductance;
   the second segment forms a second series inductance; and
   the third and fourth segments form a shunt capacitance.

5. The disk drive as recited in claim 4, wherein a width of the first and second segments is less than a width of the third and fourth segments.

6. The disk drive as recited in claim 1, wherein the interconnect comprises a substantially constant group delay over a frequency band of at least one of a read signal and a write signal.

7. The disk drive as recited in claim 6, wherein the interconnect comprises a substantially constant magnitude response over a frequency band of at least one of a read signal and a write signal.

8. The disk drive as recited in claim 1, wherein the interconnect comprises a substantially constant magnitude response over a frequency band of at least one of a read signal and a write signal.

9. The disk drive as recited in claim 1, wherein a shape of the first and second transmission lines varies along a length of the interconnect such that the interconnect comprises an approximation of an inductor/capacitor lattice network.

10. The disk drive as recited in claim 9, wherein the lattice network flattens a group delay of the interconnect.

11. A suspension for use in a disk drive, the suspension comprising an interconnect comprising a first transmission line stacked over a second transmission line, and a dielectric between the first transmission line and second transmission line, the interconnect for coupling a head to a preamp, wherein a shape of the first and second transmission lines varies along a length of the interconnect such that the interconnect comprises an approximation of an inductor/capacitor ladder network.

12. The suspension as recited in claim 11, wherein the shape of the first and second transmission lines comprises a width of the first and second transmission lines.

13. The suspension as recited in claim 12, wherein the width of the first transmission line varies symmetrically with the width of the second transmission line.

14. The suspension as recited in claim 11, wherein:
   the first transmission line comprises a first segment;
   the second transmission line comprises a second segment symmetric with the first segment;
   the first transmission line comprises a third segment;
   the second transmission line comprises a fourth segment symmetric with the third segment;
   the first segment forms a first series inductance;
   the second segment forms a second series inductance; and
   the third and fourth segments form a shunt capacitance.

15. The suspension as recited in claim 14, wherein a width of the first and second segments is less than a width of the third and fourth segments.

16. The suspension as recited in claim 11, wherein the interconnect comprises a substantially constant group delay over a frequency band of at least one of a read signal and a write signal.

17. The suspension as recited in claim 16, wherein the interconnect comprises a substantially constant magnitude response over a frequency band of at least one of a read signal and a write signal.

18. The suspension as recited in claim 11, wherein the interconnect comprises a substantially constant magnitude response over a frequency band of at least one of a read signal and a write signal.

19. The suspension as recited in claim 11, wherein a shape of the first and second transmission lines varies along a length of the interconnect such that the interconnect comprises an approximation of an inductor/capacitor lattice network.

20. The suspension as recited in claim 19, wherein the lattice network flattens a group delay of the interconnect.

21. A disk drive comprising:
   a disk;
   a head actuated over the disk;

a preamp; and an interconnect comprising a first transmission line and a second transmission line forming an approximation of at least one inductor/capacitor ladder network and an approximation of at least one inductor/capacitor lattice network, wherein the interconnect comprises a substantially constant group delay over a frequency band of at least one of a read signal and a write signal.

22. The disk drive as recited in claim 21, wherein the lattice network flattens a group delay of the interconnect.

23. A suspension for use in a disk drive, the suspension comprising an interconnect comprising a first transmission line and a second transmission line forming an approximation of at least one inductor/capacitor ladder network and an approximation of at least one inductor/capacitor lattice network, wherein the interconnect comprises a substantially constant group delay over a frequency band of at least one of a read signal and a write signal.

24. The suspension as recited in claim 23, wherein the lattice network flattens a group delay of the interconnect.

25. A disk drive comprising:
a disk;
a head actuated over the disk;
a preamp; and
an interconnect comprising a first transmission line and a second transmission line forming an approximation of at least one inductor/capacitor ladder network and an approximation of at least one inductor/capacitor lattice network,
wherein the lattice network flattens a group delay of the interconnect.

26. A suspension for use in a disk drive, the suspension comprising an interconnect comprising a first transmission line and a second transmission line forming an approximation of at least one inductor/capacitor ladder network and an approximation of at least one inductor/capacitor lattice network, wherein the lattice network flattens a group delay of the interconnect.

* * * * *